United States Patent
Rim et al.

(10) Patent No.: US 9,324,408 B2
(45) Date of Patent: Apr. 26, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventors: A Ram Rim, Seoul (KR); Ho Uk Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 30 days.

(21) Appl. No.: 14/501,968

(22) Filed: Sep. 30, 2014

(65) Prior Publication Data

US 2015/0348611 A1 Dec. 3, 2015

(30) Foreign Application Priority Data

May 29, 2014 (KR) .......................... 10-2014-0064779

(51) Int. Cl.
*G11C 7/00* (2006.01)
*G11C 11/4074* (2006.01)
*G11C 11/406* (2006.01)

(52) U.S. Cl.
CPC ...... *G11C 11/4074* (2013.01); *G11C 11/40626* (2013.01)

(58) Field of Classification Search
USPC .......................................... 365/205, 211, 222
See application file for complete search history.

(56) References Cited

U.S. PATENT DOCUMENTS

| | | | | |
|---|---|---|---|---|
| 2003/0227808 A1* | 12/2003 | Sako | ........................ | G11C 7/06 365/205 |
| 2006/0039218 A1 | 2/2006 | Takemura et al. | | |
| 2011/0128803 A1* | 6/2011 | Byeong | .................. | G11C 5/147 365/194 |

FOREIGN PATENT DOCUMENTS

KR 1020080080696 A 9/2008

* cited by examiner

*Primary Examiner* — Hoai V Ho
(74) *Attorney, Agent, or Firm* — William Park & Associates Ltd.

(57) ABSTRACT

A semiconductor memory device may include a power control signal generator and a sense amplifier circuit. The power control signal generator may generate a first power control signal, the first power control signal having an enablement period that may be controlled in response to a temperature signal having a cycle time. The cycle time may be controlled according to a mode signal and an internal temperature. The sense amplifier circuit may generate a first power signal driven to have a first drive voltage in response to the first power control signal. In addition, the sense amplifier circuit may sense and amplify a level of a bit line using the first power signal as a power supply voltage.

24 Claims, 8 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C. 119 (a) to Korean Application No. 10-2014-0064779, filed on May 29, 2014, in the Korean Intellectual Property Office, which is incorporated herein by reference in its entirety as set forth in full.

BACKGROUND

1. Technical Field

Embodiments of the present disclosure generally relate to semiconductor devices and semiconductor systems including the same.

2. Related Art

In general, a semiconductor memory device such as a dynamic random access memory (DRAM) device includes a plurality of memory cells. Each of the DRAM cells can be configured to include a single cell transistor and a single cell capacitor. The plurality of DRAM cells may be disposed at respective ones of intersections of a plurality of word lines and a plurality of bit lines. When the DRAM device operates in a read mode, one of the word lines may be selectively enabled to transfer electric charges stored in the cell capacitors of the DRAM cells connected to the selected word line onto the bit lines, and signals corresponding to the electric charges on the bit lines may be amplified by sense amplifiers connected to the bit lines. The bit lines may be pre-charged before the selected word line is enabled. The sense amplifiers may be driven by a power supply voltage. The power supply voltage may be higher than an internal voltage to obtain a fast sensing speed and a correct amplification operation thereof. This may be referred to as an over driving operation.

SUMMARY

According to various embodiments, a semiconductor device may include a power control signal generator and a sense amplifier circuit. The power control signal generator may generate a first power control signal, the first power control signal having an enablement period that may be controlled in response to a temperature signal having a cycle time. The cycle time may be controlled according to a mode signal and an internal temperature of the semiconductor device. The sense amplifier circuit may generate a first power signal driven to have a first drive voltage in response to the first power control signal. Moreover, the sense amplifier circuit may sense and amplify a level of a bit line using the first power signal as a power supply voltage.

According to various embodiments, a semiconductor device may include a command decoder suitable for decoding command signals to generate a mode signal for execution of a refresh operation, a temperature signal generator suitable for generating a temperature signal, and a power control signal generator suitable for generating a first power control signal, the first power control signal having an enablement period that may be controlled in response to the temperature signal and the mode signal. The semiconductor device may also include a sense amplifier circuit suitable for generating a first power signal driven to have a first drive voltage in response to the first power control signal and suitable for sensing and amplifying a level of a bit line using the first power signal as a power supply voltage.

According to further embodiments, a semiconductor system may include a controller and a semiconductor device. The controller may output command signals and temperature code signals. The semiconductor device may decode the command signals to generate a mode signal and generate a first power control signal, the first power control signal having an enablement period that may be controlled in response to the mode signal and the temperature code signals. In addition, the semiconductor device may sense and amplify a level of a bit line using a first power signal driven to a first drive voltage in response to the first power control signal as a power supply voltage.

DETAILED DESCRIPTION

Various embodiments will be described hereinafter with reference to the accompanying drawings. However, the embodiments described herein are for illustrative purposes only and are not intended to limit the scope of the description.

Figure 1:
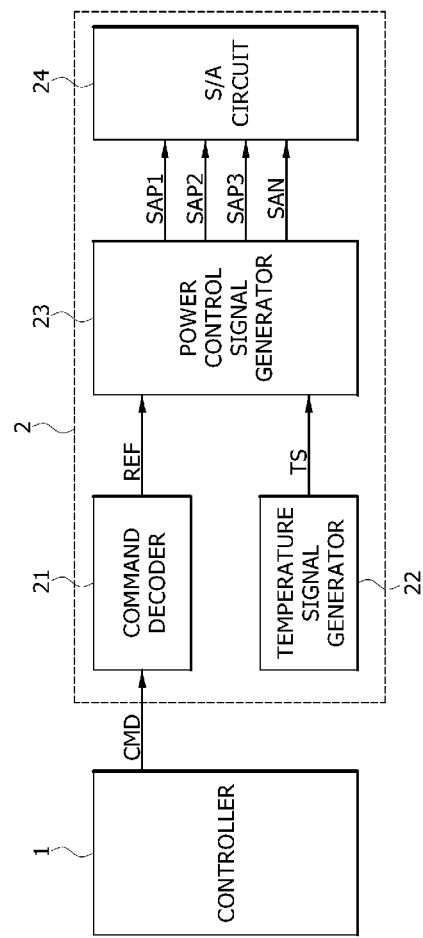
FIG. 1 is a block diagram illustrating a representation of a semiconductor system according to an embodiment.

As illustrated in FIG. 1, a semiconductor system according to an embodiment may include a controller 1 and a semiconductor device 2. The semiconductor device 2 may include a command decoder 21, a temperature signal generator 22, a power control signal generator 23, and a sense amplifier (S/A) circuit 24.

The controller 1 may generate command signals CMD. The controller 1 may apply the command signals CMD to the semiconductor device 2. The command signals CMD may be transmitted to the semiconductor device 2 through transmission lines (not shown) or other signal lines according to the various embodiments. Similarly, although not illustrated in the drawings, address signals may also be transmitted from the controller 1 to the semiconductor device 2 through the transmission lines or the other signal lines according to the various embodiments.

The command decoder 21 may decode the command signals CMD to generate a mode signal REF. The mode signal REF may be a signal which is enabled during a refresh operation. A level of the enabled mode signal REF may be set to have a logic "high" level or a logic "low" level according to the various embodiments. In various embodiments, the mode signal REF may be enabled by an operation other than the refresh operation. For example but not limited to these examples, the mode signal REF may also be enabled when a read operation, a write operation, or a power down operation is executed.

The temperature signal generator 22 may generate a temperature signal TS. The temperature signal may have a cycle time that may be controlled according to an internal temperature of the semiconductor device 2. The cycle time of the temperature signal TS may be reduced as the internal temperature of the semiconductor device 2 rises upward or increases. Also the cycle time of the temperature signal TS may be increased as the internal temperature of the semiconductor device 2 falls downward or decreases. In various embodiments, the cycle time of the temperature signal TS may be diversely changed as the internal temperature of the semiconductor device 2 varies.

The power control signal generator 23 may generate a first power control signal SAP1, a second power control signal SAP2, a third power control signal SAP3, and a fourth power control signal SAN. The first, second, third, and fourth power control signals SAP1, SAP2, SAP3, and SAN may be generated in response to the mode signal REF and the temperature signal TS. The power control signal generator 23 may generate the third power control signal SAP3. The enablement period of the third power control signal SAP3 may be controlled according to the temperature signal TS while a period that the mode signal REF is enabled during the refresh operation. More specifically, the power control signal generator 23 may generate the third power control signal SAP3. The enablement period of the third power control signal SAP3 may be increased by the temperature signal TS. The temperature signal TS having a cycle time which may be reduced if the internal temperature of the semiconductor device 2 rises upward or increases. In addition, the power control signal generator 23 may generate the third power control signal SAP3. The enablement period of the third power control signal SAP3 may be reduced by the temperature signal TS. The temperature signal TS having a cycle time which may be increased if the internal temperature of the semiconductor device 2 falls downward or decreases. In various embodiments, the power control signal generator 23 may be realized to control an enablement period of any one among the first, second, and fourth power control signals SAP1, SAP2 and SAN according to variation of the internal temperature of the semiconductor device 2. Alternatively, the power control signal generator 23 may be realized to control enablement periods of at least two signals among the first to fourth power control signals SAP1, SAP2, SAP3 and SAN according to a variation of the internal temperature of the semiconductor device 2.

The S/A circuit 24 may sense and amplify a level difference between a bit line (BL of FIG. 3) and a complementary bit line (BLB of FIG. 3) in response to the first to fourth power control signals SAP1, SAP2, SAP3 and SAN. The first, second and third power control signals SAP1, SAP2 and SAP3 may control a level of a first power signal (RTO of FIG. 3) that is supplied to a bit line S/A (242 of FIG. 3) included in the S/A circuit 24. The fourth power control signal SAN may control a level of a second power signal (SB of FIG. 3) that is supplied to the bit line S/A 242 included in the S/A circuit 24. As described above, the enablement period of the third power control signal SAP3 supplied to the S/A circuit 24 may increase as the internal temperature of the semiconductor device 2 rises upward or increases. Also, as described above, the enablement period of the third power control signal SAP3 supplied to the S/A circuit 24 may decrease as the internal temperature of the semiconductor device 2 falls downward or decreases. A detailed configuration and a detailed operation of the S/A circuit 24 will be described with reference to FIG. 3 later.

Figure 2:
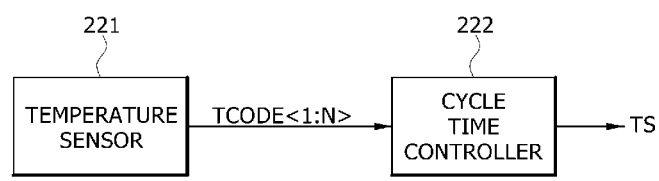
FIG. 2 is a block diagram illustrating a representation of a temperature signal generator included in the semiconductor system of FIG. 1.

Referring now to FIG. 2, the temperature signal generator 22 may include a temperature sensor 221 and a cycle time controller 222.

The temperature sensor 221 may generate temperature code signals TCODE<1:N> including information on the internal temperature of the semiconductor device 2. The temperature code signals TCODE<1:N> may be set to have a logic level combination corresponding to one of various ranges of the internal temperature. For example but not limited to these examples, the temperature code signals TCODE<1:N> may be set to have a logic level combination of "00" if the internal temperature is below 0 degree Celsius, a logic level combination of "01" if the internal temperature is within a range of 0 degree Celsius to 45 degrees Celsius, a logic level combination of "10" if the internal temperature is within a range of 45 degrees Celsius to 90 degrees Celsius, and a logic level combination of "11" if the internal temperature is over 90 degrees Celsius. If the temperature code signals TCODE<1:N> have a logic level combination of "01", the temperature code signal TCODE<1> may have a logic "high(1)" level and the temperature code signal TCODE<2> may have a logic "low(0)" level. In addition, if the temperature code signals TCODE<1:N> have a logic level combination of "10", the temperature code signal TCODE<1> may have a logic "low(0)" level and the temperature code signal TCODE<2> may have a logic "high(1)" level. The number "N" of bits of the temperature code signals TCODE<1: N> and the logic level combinations of the temperature code signals TCODE<1:N> corresponding to the various ranges of the internal temperature may be set to be different according to the various embodiments.

The cycle time controller 222 may generate the temperature signal TS. The cycle time of the temperature signal may be controlled according to the temperature code signals TCODE<1:N>. The cycle time controller 222 may detect the range of the internal temperature according to the logic levels of the temperature code signals TCODE<1:N> and may control the temperature signal TS such that the temperature signal TS has a cycle time corresponding to the detected range of the internal temperature. For example, the cycle time controller 222 may decrease a cycle time of the temperature signal TS if the internal temperature rises upward or increases and may increase a cycle time of the temperature signal TS if the internal temperature falls downward or decreases.

Figure 3:
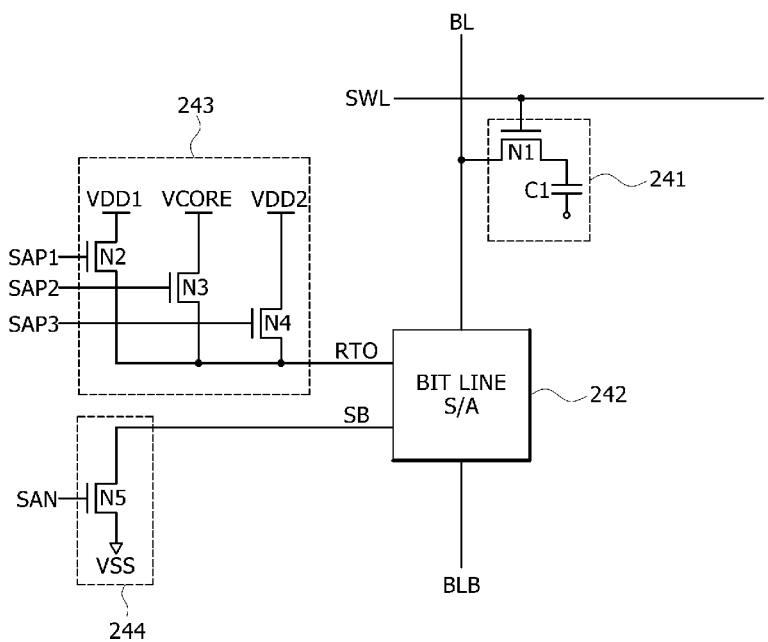
FIG. 3 is a block diagram representation illustrating a sense amplifier circuit included in the semiconductor system of FIG. 1.

Referring to FIG. 3, the S/A circuit 24 may include a memory cell 241, a bit line S/A 242, a first power signal driver 243 and a second power signal driver 244.

The memory cell 241 may include a cell transistor N1 (e.g., an NMOS transistor) and a cell capacitor C1 connected to a source of the cell transistor N1. If a word line SWL connected to a gate of the cell transistor N1 is selectively enabled to have a logic "high" level while the refresh operation is executed, the cell transistor N1 may be turned on to cause a charge sharing phenomenon between the cell capacitor C1 and the bit line BL connected to a drain of the cell transistor N1. The word line SWL may be selected even while an active operation such as the read operation or the write operation is executed.

The bit line S/A 242 may receive the first power signal RTO and the second power signal SB to sense and amplify a level difference between the bit line BL and the complementary bit line BLB. The bit line S/A 242 may sense a minute voltage difference generated between the bit line BL and the complementary bit line BLB due to the charge sharing phenomenon and may amplify the minute voltage difference between the bit line BL and the complementary bit line BLB.

The first power signal driver 243 may include NMOS transistors N2, N3 and N4 that drive the first power signal RTO in response to the first, second and third power control signals SAP1, SAP2 and SAP3. The NMOS transistor N2 may be turned on to drive the first power signal RTO to a first drive voltage VDD1 while the first power control signal SAP1 is enabled to have a logic "high" level. The NMOS transistor N3 may be turned on to drive the first power signal RTO to a second drive voltage VCORE while the second power control signal SAP2 is enabled to have a logic "high" level. The NMOS transistor N4 may be turned on to drive the first power signal RTO to a third drive voltage VDD2 while the third power control signal SAP3 is enabled to have a logic "high" level. According to an embodiment, the third drive voltage VDD2 may be set to have a level higher than the first drive voltage VDD1 and the first drive voltage VDD1 may be set to have a level higher than the second drive voltage VCORE. However, the first, second and third drive voltages VDD1, VSCORE and VDD2 may be set to have various levels according to the various embodiments.

The second power signal driver 244 may include an NMOS transistor N5. The NMOS transistor N5 may drive the second power signal SB in response to the fourth power control signal SAN. The NMOS transistor N5 may be turned on to drive the second power signal SB to a ground voltage VSS while the fourth power control signal SAN is enabled to have a logic "high" level.

Figure 4:
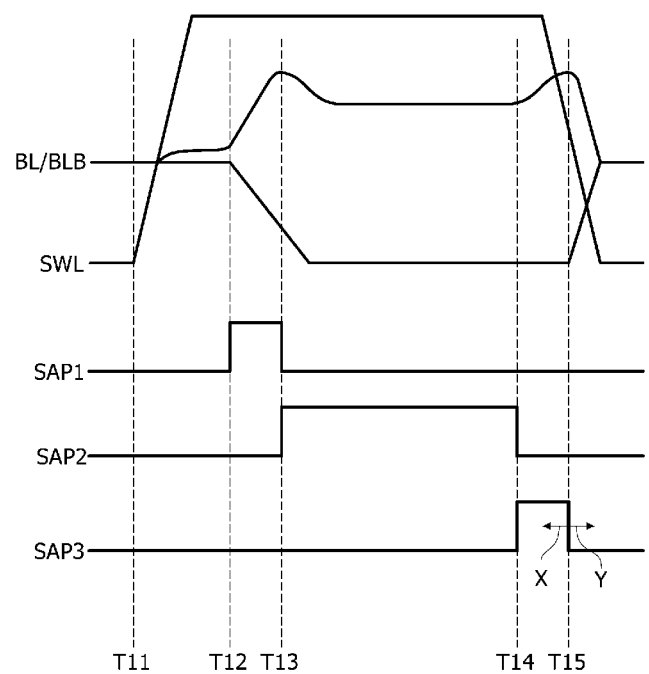
FIG. 4 is a timing diagram representation illustrating an operation of the semiconductor system illustrated in FIG. 1.

An operation of the semiconductor system having the aforementioned configuration will be described hereinafter with reference to FIG. 4.

At a point of time "T11", if the word line SWL is enabled to have a logic "high" level to execute the refresh operation, a minute voltage difference may be generated between the bit line BL and the complementary bit line BLB due to a charge sharing phenomenon.

During a first period from a point of time "T12" until a point of time "T13", the first power control signal SAP1 may be enabled to have a logic "high" level to drive the first power signal RTO to the first drive voltage VDD1. The bit line S/A 242 to which the first power signal RTO is supplied may sense and amplify a voltage difference between the bit line BL and the complementary bit line BLB. The first drive voltage VDD1 may be a power supply voltage which is supplied from an external device or an external system to execute an over driving operation.

During a second period from the point of time "T13" until a point of time "T14", the second power control signal SAP2 may be enabled to have a logic "high" level to drive the first power signal RTO to the second drive voltage VCORE. The bit line S/A 242 to which the first power signal RTO is supplied may sense and amplify a voltage difference between the bit line BL and the complementary bit line BLB. The second drive voltage VCORE may be an internal voltage which is supplied to a memory cell array region (not shown).

During a third period from the point of time "T14" until a point of time "T15", the third power control signal SAP3 may be enabled to have a logic "high" level to drive the first power signal RTO to the third drive voltage VDD2. The bit line S/A 242 to which the first power signal RTO is supplied may sense and amplify a voltage difference between the bit line BL and the complementary bit line BLB. The third drive voltage VDD2 may be a power supply voltage which is supplied from an external device or an external system to execute an over driving operation. An enablement period of the third power control signal SAP3 may be controlled by the internal temperature. As described above, the enablement period of the third power control signal SAP3 may be reduced as the internal temperature falls downward or decreases (see a direction denoted by the reference character "X" of FIG. 4) and may be increased as the internal temperature rises upward or increases (see a direction denoted by the reference character "Y" of FIG. 4). In various embodiments, if the internal temperature falls down below a predetermined temperature, the third power control signal SAP3 may be set to be disabled without any enablement period. In such cases, the first power signal RTO may not be over-driven by the third drive voltage VDD2.

As described above, the semiconductor system according to the embodiments may control a period wherein the first power signal RTO supplied to the bit line S/A 242 is over-driven to have the third drive voltage VDD2, according to variation of the internal temperature. That is, if the internal temperature falls downward or decreases, the semiconductor system according to the various embodiments may reduce a period that the first power signal RTO is over-driven to have the third drive voltage VDD2, thereby reducing power consumption of the bit line S/A 242. A data retention time of the memory cells may increase as a temperature (i.e., the internal temperature) falls downward or decreases. Thus, even though the internal temperature falls downward or decreases to reduce or vanish the period that the first power signal RTO is over-driven, the bit line S/A 242 may operate without any malfunctions.

Figure 5:
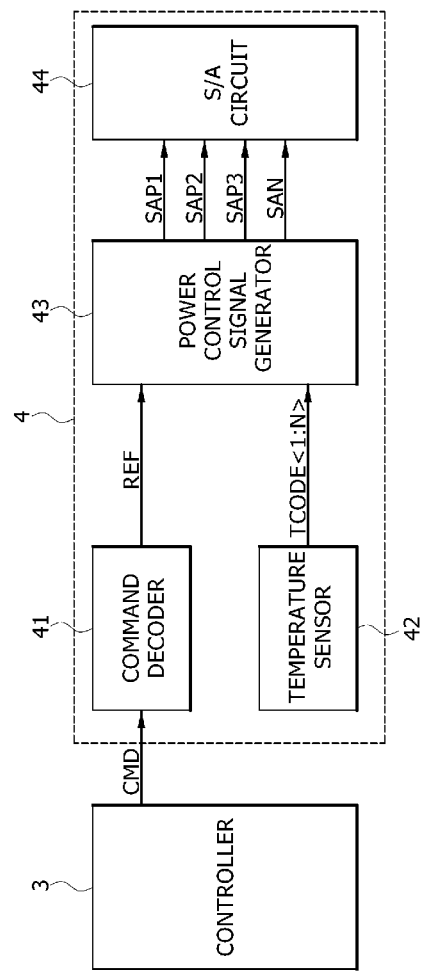
FIG. 5 is a block diagram representation illustrating a semiconductor system according to an embodiment.

As illustrated in FIG. 5, a semiconductor system according to an embodiment may include a controller 3 and a semiconductor device 4. The semiconductor device 4 may include a command decoder 41 and a temperature sensor 42. The semiconductor device may also include a power control signal generator 43, and a sense amplifier (S/A) circuit 44.

The controller 3 may generate command signals CMD. The controller 3 may apply the command signals CMD to the semiconductor device 4. The command signals CMD may be transmitted to the semiconductor device 4 through transmission lines (not shown) or other signal lines according to the various embodiments. Similarly, although not shown in the drawings, address signals may also be transmitted from the controller 3 to the semiconductor device 4 through the transmission lines or the other signal lines according to the various embodiments.

The command decoder 41 may decode the command signals CMD to generate a mode signal REF. The mode signal REF may be a signal which is enabled during a refresh operation. A level of the enabled mode signal REF may be set to have a logic "high" level or a logic "low" level according to the various embodiments. In some embodiments, the mode signal REF may be enabled by an operation other than the refresh operation. For example but not limited to these examples, the mode signal REF may also be enabled when a read operation, a write operation, or a power down operation is executed.

The temperature sensor 42 may generate temperature code signals TCODE<1:N>. The temperature code signals TCODE<1:N> may include information on an internal temperature of the semiconductor device 4. The temperature code signals TCODE<1:N> may be set to have a logic level combination corresponding to one of various ranges of the internal temperature of the semiconductor device 4. For example, the temperature code signals TCODE<1:N> may be set to have a logic level combination of "00" if the internal temperature is below 0 degree Celsius, a logic level combination of "01" if the internal temperature is within a range of 0 degree Celsius to 45 degrees Celsius, a logic level combination of "10" if the internal temperature is within a range of 45 degrees Celsius to 90 degrees Celsius, and a logic level combination of "11" if the internal temperature is over 90 degrees Celsius. If the temperature code signals TCODE<1:N> have a logic level combination of "01", the temperature code signal TCODE<1> may have a logic "high(1)" level and the temperature code signal TCODE<2> may have a logic "low(0)" level. In addition, if the temperature code signals TCODE<1: N> have a logic level combination of "10", the temperature code signal TCODE<1> may have a logic "low(0)" level and the temperature code signal TCODE<2> may have a logic "high(1)" level. The number "N" of bits of the temperature code signals TCODE<1: N> and the logic level combinations of the temperature code signals TCODE<1:N> corresponding to the various ranges of the internal temperature may be set to be different according to the various embodiments.

The power control signal generator 43 may generate a first power control signal SAP1, a second power control signal SAP2, a third power control signal SAP3, and a fourth power control signal SAN. The first, second, third and fourth power control signals SAP1, SAP2, SAP3, and SAN may be generated in response to the mode signal REF and the temperature code signals TCODE<1:N>. The power control signal generator 43 may generate the third power control signal SAP3. The enablement period of the third power control signal SAP3 may be controlled according to the temperature code signals TCODE<1:N> while a period that the mode signal REF is enabled during the refresh operation. More specifically, the power control signal generator 43 may generate the third power control signal SAP3. The enablement period of the power control signal SAP3 is increased if the internal temperature increases and the temperature code signals TCODE<1:N> having a logic level combination corresponding to the increased internal temperature are inputted thereto. In contrast, the power control signal generator 43 may generate the third power control signal SAP3, the third power control signal SAP3 having an enablement period that may be reduced if the internal temperature is lowered and the temperature code signals TCODE<1:N> having a logic level combination corresponding to the lowered internal temperature are inputted thereto. In various embodiments, the power control signal generator 43 may be realized to control an enablement period of any one among the first, second and fourth power control signals SAP1, SAP2 and SAN according to variation of the internal temperature of the semiconductor device 4. Alternatively, the power control signal generator 43 may be realized to control enablement periods of at least two signals among the first to fourth power control signals SAP1, SAP2, SAP3 and SAN according to variation of the internal temperature of the semiconductor device 4.

The S/A circuit 44 may sense and amplify a level difference between a selected bit line (not shown) and a selected complementary bit line (not shown) in response to the first to fourth power control signals SAP1, SAP2, SAP3 and SAN. As described in the previous embodiments, the enablement period of the third power control signal SAP3 supplied to the S/A circuit 44 may increase as the internal temperature of the semiconductor device 4 rises upward or increases and may decrease as the internal temperature of the semiconductor device 4 falls downward or decreases.

The semiconductor system illustrated in FIG. 5 may control a period wherein the first power signal RTO is over-driven to have the third drive voltage VDD2, according to a variation of the internal temperature. In such cases, the semiconductor system illustrated in FIG. 5 may control the enablement period of the third power control signal SAP3 using the temperature code signals TCODE<1:N> instead of the temperature signal TS, unlike the semiconductor system shown in FIG. 1.

Figure 6:
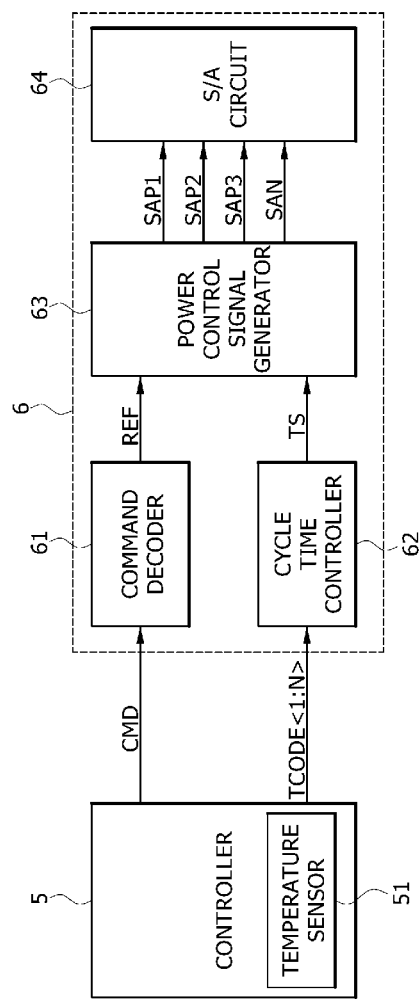
FIG. 6 is a block diagram illustrating a representation of a semiconductor system according to an embodiment.

As illustrated in FIG. 6, a semiconductor system according to an embodiment may include a controller 5 and a semiconductor device 6. The controller 5 may include a temperature sensor 51. The semiconductor device 6 may include a command decoder 61, and a cycle time controller 62. The semiconductor device 6 may also include a power control signal generator 63 and a sense amplifier (S/A) circuit 64.

The controller 5 may apply command signals CMD and temperature code signals TCODE<1:N> to the semiconductor device 6. The command signals CMD may be transmitted to the semiconductor device 6 through transmission lines (not shown) or other signal lines according to the various embodiments. Similarly, although not shown in the drawings, address signals may also be transmitted from the controller 5 to the semiconductor device 6 through the transmission lines or the other signal lines according to the various embodiments. The temperature sensor 51 may generate temperature code signals TCODE<1:N> including information on an internal temperature of the semiconductor device 6. The temperature code signals TCODE<1:N> may be set to have a logic level combination corresponding to one of various ranges of the internal temperature of the semiconductor device 6. For example but not limited to these examples, the temperature code signals TCODE<1:N> may be set to have a logic level combination of "00" if the internal temperature is below 0 degree Celsius, a logic level combination of "01" if the internal temperature is within a range of 0 degree Celsius to 45 degrees Celsius, a logic level combination of "10" if the internal temperature is within a range of 45 degrees Celsius to 90 degrees Celsius, and a logic level combination of "11" if the internal temperature is over 90 degrees Celsius. If the temperature code signals TCODE<1:N> have a logic level combination of "01", the temperature code signal TCODE<1> may have a logic "high(1)" level and the temperature code signal TCODE<2> may have a logic "low(0)" level. In addition, if the temperature code signals TCODE<1: N> have a logic level combination of "10", the temperature code signal TCODE<1> may have a logic "low(0)" level and the temperature code signal TCODE<2> may have a logic "high(1)" level. The number "N" of bits of the temperature code signals TCODE<1:N> and the logic level combinations of the temperature code signals TCODE<1:N> corresponding to the various ranges of the internal temperature may be set to be different according to the various embodiments.

The command decoder 61 may decode the command signals CMD to generate a mode signal REF. The mode signal REF may be a signal which is enabled during a refresh operation. A level of the enabled mode signal REF may be set to have a logic "high" level or a logic "low" level according to the various embodiments. In some embodiments, the mode signal REF may be enabled by an operation other than the refresh operation. For example, the mode signal REF may also be enabled when a read operation, a write operation, or a power down operation is executed.

The cycle time controller 62 may generate a temperature signal TS. The temperature signal TS may have cycle time that is controlled according to the temperature code signals TCODE<1:N>. The cycle time controller 62 may detect the range of the internal temperature according to logic levels of the temperature code signals TCODE<1:N> and may control the temperature signal TS such that the temperature signal TS has a cycle time corresponding to the detected range of the internal temperature. For example, the cycle time controller 62 may decrease a cycle time of the temperature signal TS if the internal temperature rises upward or increases and may increase a cycle time of the temperature signal TS if the internal temperature falls downward or decreases.

The power control signal generator 63 may generate a first power control signal SAP1, a second power control signal SAP2, a third power control signal SAP3 and a fourth power control signal SAN. The first, second, third, and fourth power control signals SAP1, SAP2, SAP3, and SAN may be generated in response to the mode signal REF and the temperature signal TS. The power control signal generator 63 may generate the third power control signal SAP3. The enablement period of the third power control signal SAP3 may be controlled according to the temperature signals TS while a period that the mode signal REF is enabled during the refresh operation. More specifically, the power control signal generator 63 may generate the third power control signal SAP3. The enablement period of the third power control signal SAP3 may be increased if a cycle time of the temperature signal TS is reduced as the internal temperature rises upward or increases. In contrast, the power control signal generator 63 may generate the third power control signal SAP3 having an enablement period that may be reduced if a cycle time of the temperature signal TS is increased as the internal temperature falls downward or decreases. In various embodiments, the power control signal generator 63 may be realized to control an enablement period of any one among the first, second and fourth power control signals SAP1, SAP2 and SAN according to variation of the internal temperature of the semiconductor device 6. Alternatively, the power control signal generator 63 may be realized to control enablement periods of at least two signals among the first to fourth power control signals SAP1, SAP2, SAP3 and SAN according to a variation of the internal temperature of the semiconductor device 6.

The S/A circuit 64 may sense and amplify a level difference between a selected bit line (not shown) and a selected complementary bit line (not shown) in response to the first to fourth power control signals SAP1, SAP2, SAP3 and SAN. As described in the previous embodiments, the enablement period of the third power control signal SAP3 supplied to the S/A circuit 64 may increase as the internal temperature of the semiconductor device 6 rises upward or increases, and may decrease as the internal temperature of the semiconductor device 6 falls downward or decreases.

The semiconductor system illustrated in FIG. 6 may control a period wherein the first power signal RTO is over-driven to have the third drive voltage VDD2, according to a variation of the internal temperature. In such cases, the temperature sensor 51 generating the temperature code signals TCODE<1:N> may be included in the controller 5 unlike the semiconductor system shown in FIG. 1.

Figure 7:
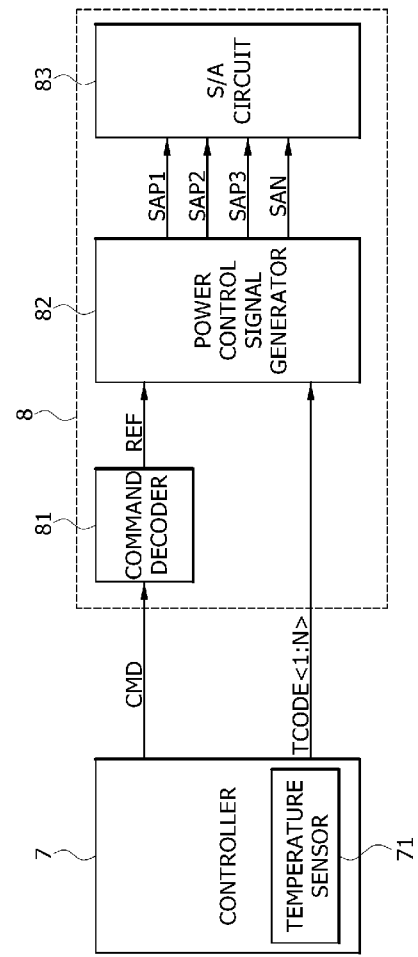
FIG. 7 is a block diagram illustrating a representation of a semiconductor system according to an embodiment.

Referring to FIG. 7, a semiconductor system according to an embodiment may include a controller 7 and a semiconductor device 8. The controller 7 may include a temperature sensor 71. The semiconductor device 8 may include a command decoder 81, a power control signal generator 82 and a sense amplifier (S/A) circuit 83.

The controller 7 may apply command signals CMD and temperature code signals TCODE<1:N> to the semiconductor device 8. The command signals CMD may be transmitted to the semiconductor device 8 through transmission lines (not shown) or other signal lines according to the various embodiments. Similarly, although not shown in the drawings, address signals may also be transmitted from the controller 7 to the semiconductor device 8 through the transmission lines or the other signal lines according to the various embodiments. The temperature sensor 71 may generate temperature code signals TCODE<1:N>. The temperature code signals TCODE<1:N> may include information on an internal temperature of the semiconductor device 8. The temperature code signals TCODE<1:N> may be set to have a logic level combination corresponding to one of various ranges of the internal temperature. For example but not limited to these examples, the temperature code signals TCODE<1:N> may be set to have a logic level combination of "00" if the internal temperature is below 0 degree Celsius, a logic level combination of "01" if the internal temperature is within a range of 0 degree Celsius to 45 degrees Celsius, a logic level combination of "10" if the internal temperature is within a range of 45 degrees Celsius to 90 degrees Celsius, and a logic level combination of "11" if the internal temperature is over 90 degrees Celsius. If the temperature code signals TCODE<1:N> have a logic level combination of "01", the temperature code signal TCODE<1> may have a logic "high(1)" level and the temperature code signal TCODE<2> may have a logic "low(0)" level. In addition, if the temperature code signals TCODE<1:N> have a logic level combination of "10", the temperature code signal TCODE<1> may have a logic "low(0)" level and the temperature code signal TCODE<2> may have a logic "high(1)" level. The number "N" of bits of the temperature code signals TCODE<1:N> and the logic level combinations of the temperature code signals TCODE<1:N> corresponding to the various ranges of the internal temperature may be set to be different according to the various embodiments.

The command decoder 81 may decode the command signals CMD to generate a mode signal REF. The mode signal REF may be a signal which is enabled for execution of a refresh operation. A level of the enabled mode signal REF may be set to have a logic "high" level or a logic "low" level according to the various embodiments. In some embodiments, the mode signal REF may be enabled by an operation other than the refresh operation. For example but not limited to these examples, the mode signal REF may also be enabled when a read operation, a write operation, or a power down operation is executed.

The power control signal generator 82 may generate a first power control signal SAP1, a second power control signal SAP2, a third power control signal SAP3 and a fourth power control signal SAN. The first, second, third, and fourth power control signals SAP1, SAP2, SAP3, and SAN may be generated in response to the mode signal REF and the temperature code signals TCODE<1:N>. The power control signal generator 82 may generate the third power control signal SAP3. The enablement period of the third power control signal SAP3 may be controlled according to the temperature code signals TCODE<1:N> while a period that the mode signal REF is enabled during the refresh operation. More specifically, the power control signal generator 82 may generate the third power control signal SAP3 having an enablement period that may be increased if the internal temperature increases and the temperature code signals TCODE<1:N> having a logic level combination corresponding to the increased internal temperature are inputted thereto. In contrast, the power control signal generator 82 may generate the third power control signal SAP3 having an enablement period that may be reduced if the internal temperature is lowered and the temperature code signals TCODE<1:N> having a logic level combination corresponding to the lowered internal temperature are inputted thereto. In various embodiments, the power control signal generator 82 may be realized to control an enablement period of any one among the first, second and fourth power control signals SAP1, SAP2 and SAN according to variation of the internal temperature of the semiconductor device 8. Alternatively, the power control signal generator 82 may be realized to control enablement periods of at least two signals among the first to fourth power control signals SAP1, SAP2, SAP3 and SAN according to variation of the internal temperature of the semiconductor device 8.

The S/A circuit 83 may sense and amplify a level difference between a selected bit line (not shown) and a selected complementary bit line (not shown) in response to the first to fourth power control signals SAP1, SAP2, SAP3 and SAN. As described in the previous embodiments, the enablement period of the third power control signal SAP3 supplied to the S/A circuit 83 may increase as the internal temperature of the semiconductor device 8 rises upward or increases and may decrease as the internal temperature of the semiconductor device 8 falls downward or decreases.

The semiconductor system illustrated in FIG. 7 may control a period wherein the first power signal RTO is over-driven to have the third drive voltage VDD2, according to a variation of the internal temperature. In such cases, the temperature sensor 71 generating the temperature code signals TCODE<1:N> may be included in the controller 7 and the enablement period of the third power control signal SAP3 may be controlled by the temperature code signals TCODE<1:N> instead of the temperature signal TS, unlike the semiconductor system shown in FIG. 1.

Figure 8:
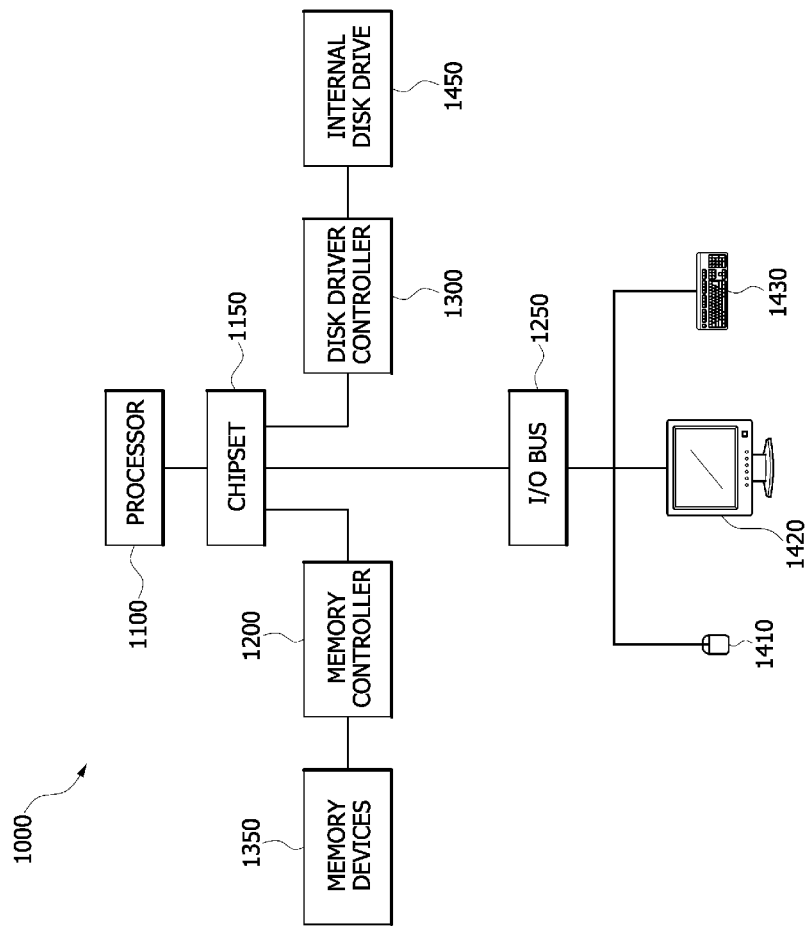
FIG. 8 illustrates a block diagram representation of an example of a system employing the semiconductor system in accordance with the embodiments discussed above with relation to FIGS. 1-7.

The semiconductor system discussed above is particular useful in the design of memory devices, processors, and computer systems. For example, referring to FIG. 8, a block diagram of a representation of a system employing the semiconductor system in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system and/or controllers and/or semiconductor devices as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor system and/or semiconductor devices and/or controllers as discussed above with relation to FIGS. 1-7, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor system as discussed above with relation to FIGS. 1-7. In alternate embodiments, such as cellular phones or digital cameras, the components may differ from the embodiments illustrated in FIG. 8.

According to the embodiments set forth above, a period that a power supply voltage is applied to a bit line S/A may be controlled according to a temperature. Thus, power consumption of the bit line S/A may be reduced.

What is claimed is:

1. A semiconductor device comprising:
   a power control signal generator suitable for generating a first power control signal; and
   a sense amplifier circuit suitable for generating a first power signal driven to have a first drive voltage in response to the first power control signal and suitable for sensing and amplifying a level of a bit line using the first power signal as a power supply voltage, and
   wherein the first power control signal has an enablement period, the enablement period being controlled in response to a temperature signal, the temperature signal having a cycle time, the cycle time being controlled according to a mode signal and an internal temperature of the semiconductor device.

2. The semiconductor device of claim 1, wherein the mode signal is enabled for execution of a refresh operation.

3. The semiconductor device of claim 2, wherein the power control signal generator controls the enablement period of the first power control signal according to the cycle time of the temperature signal while the mode signal is enabled.

4. The semiconductor device of claim 1, wherein the temperature signal has a cycle time that decreases as the internal temperature of the semiconductor device increases.

5. The semiconductor device of claim 4, wherein the power control signal generator increases the enablement period of the first power control signal as the internal temperature of the semiconductor device increases.

6. The semiconductor device of claim 1, wherein the temperature signal has a cycle time that increases as the internal temperature of the semiconductor device decreases.

7. The semiconductor device of claim 6, wherein the power control signal generator decreases the enablement period of the first power control signal as the internal temperature of the semiconductor device decreases.

8. The semiconductor device of claim 1,
wherein the sense amplifier circuit generates the first power signal which is driven to have a second drive voltage in response to a second power control signal during a first period after a memory cell is selected by a word line;
wherein the sense amplifier circuit generates the first power signal which is driven to have a third drive voltage in response to a third power control signal during a second period, the second period beginning from a point of time after the first period ends; and
wherein the sense amplifier circuit generates the first power signal which is driven to have the first drive voltage in response to the first power control signal during a third period, the third period beginning from a point of time after the second period ends.

9. The semiconductor device of claim 8, wherein the first drive voltage is set to be higher than the second drive voltage and the second drive voltage is set to be higher than the third drive voltage.

10. A semiconductor device comprising:
a command decoder suitable for decoding command signals to generate a mode signal for execution of a refresh operation;
a temperature signal generator suitable for generating a temperature signal;
a power control signal generator suitable for generating a first power control signal; and
a sense amplifier circuit suitable for generating a first power signal driven to have a first drive voltage in response to the first power control signal and suitable for sensing and amplifying a level of a bit line using the first power signal as a power supply voltage, and
wherein the first power control signal has an enablement period, the enablement period being controlled in response to the temperature signal and the mode signal.

11. The semiconductor device of claim 10, wherein the mode signal is enabled for execution of the refresh operation.

12. The semiconductor device of claim 11, wherein the temperature signal generator includes:
a temperature sensor suitable for sensing an internal temperature of the semiconductor device to generate temperature code signals; and
a cycle time controller suitable for controlling a cycle time of the temperature signal according to the temperature code signals.

13. The semiconductor device of claim 11, wherein the power control signal generator controls the enablement period of the first power control signal according to the cycle time of the temperature signal while the mode signal is enabled.

14. The semiconductor device of claim 11, wherein the temperature signal has a cycle time that decreases as an internal temperature of the semiconductor device increases.

15. The semiconductor device of claim 14, wherein the power control signal generator increases the enablement period of the first power control signal as the internal temperature of the semiconductor device increases.

16. The semiconductor device of claim 11,
wherein the sense amplifier circuit generates the first power signal which is driven to have a second drive voltage in response to a second power control signal during a first period after a memory cell is selected by a word line;
wherein the sense amplifier circuit generates the first power signal which is driven to have a third drive voltage in response to a third power control signal during a second period, the second period beginning from a point of time after the first period ends; and
wherein the sense amplifier circuit generates the first power signal which is driven to have the first drive voltage in response to the first power control signal during a third period, the third period beginning from a point of time after the second period ends.

17. A semiconductor system comprising:
a controller suitable for outputting command signals and temperature code signals; and
a semiconductor device suitable for decoding the command signals to generate a mode signal, suitable for generating a first power control signal, and suitable for sensing and amplifying a level of a bit line using a first power signal driven to a first drive voltage in response to the first power control signal as a power supply voltage,
wherein the first power control signal has an enablement period, the enablement period being controlled in response to the mode signal and the temperature code signals.

18. The semiconductor system of claim 17, wherein the semiconductor device includes:
a power control signal generator suitable for generating the first power control signal, the first power control signal having an enablement period that is controlled in response to the mode signal being enabled for execution of a refresh operation and the temperature code signals; and
a sense amplifier circuit suitable for sensing and amplifying the level of the bit line using the first power signal driven to the first drive voltage in response to the first power control signal as a power supply voltage.

19. The semiconductor system of claim 18, wherein the power control signal generator increases the enablement period of the first power control signal as an internal temperature of the semiconductor device increases.

20. The semiconductor system of claim 17, wherein the semiconductor device includes:
a cycle time controller suitable for generating a temperature signal, the temperature signal having a cycle time that is controlled according to the temperature code signals;
a power control signal generator suitable for generating the first power control signal, the first power control signal having an enablement period that is controlled in response to the mode signal enabled for execution of a refresh operation and the temperature signal; and
a sense amplifier circuit suitable for sensing and amplifying the level of the bit line using the first power signal driven to the first drive voltage in response to the first power control signal as a power supply voltage.

21. The semiconductor system of claim 20, wherein the temperature signal has a cycle time that decreases as an internal temperature of the semiconductor device increases.

22. The semiconductor system of claim 21, wherein the power control signal generator increases the enablement period of the first power control signal as the internal temperature of the semiconductor device increases.

23. The semiconductor system of claim 20,
wherein the sense amplifier circuit generates the first power signal which is driven to have a second drive voltage in response to a second power control signal during a first period after a memory cell is selected by a word line;
wherein the sense amplifier circuit generates the first power signal which is driven to have a third drive voltage in response to a third power control signal during a second period, the second period beginning from a point of time after the first period ends; and wherein the sense amplifier circuit generates the first power signal which is driven to have the first drive voltage in response to the first power control signal during a third period, the third period beginning from a point of time after the second period ends.

24. The semiconductor system of claim 23, wherein the first drive voltage is set to be higher than the second drive voltage and the second drive voltage is set to be higher than the third drive voltage.

* * * * *